United States Patent [19]
Kutzner et al.

[11] Patent Number: 6,070,333
[45] Date of Patent: Jun. 6, 2000

[54] ELECTRONIC COMPASS

[75] Inventors: Michael Kutzner; Erich Hufgard, both of Regensburg, Germany

[73] Assignee: Siemens Aktiengesellschaft, Munich, Germany

[21] Appl. No.: 09/013,300

[22] Filed: Jan. 26, 1998

[30] Foreign Application Priority Data

Jan. 24, 1997 [DE] Germany ............... 297 01 180 U
Apr. 16, 1997 [DE] Germany ............... 197 15 931

[51] Int. Cl.$^7$ .................. G01C 17/28; G01R 33/02
[52] U.S. Cl. .............. 33/355 R; 33/361; 33/363 R; 33/363 Q; 324/244; 324/259; 324/260
[58] Field of Search ............. 33/355 R, 361, 33/363 R, 363 Q; 324/244, 247, 252, 259, 260

[56] References Cited

U.S. PATENT DOCUMENTS

| | | | |
|---|---|---|---|
| 4,053,829 | 10/1977 | Maruo | 33/363 R |
| 4,232,451 | 11/1980 | Thomsen | 33/361 |
| 4,464,625 | 8/1984 | Lienhard et al. | 324/252 |
| 4,640,016 | 2/1987 | Tanner et al. | 33/361 |
| 4,727,323 | 2/1988 | Zabler | 324/252 |
| 5,351,005 | 9/1994 | Rouse et al. | 324/252 |
| 5,493,218 | 2/1996 | Hayashi et al. | 324/252 |
| 5,644,851 | 7/1997 | Blank et al. | 33/361 |
| 5,650,721 | 7/1997 | van den Berg et al. | 324/207.21 |
| 5,751,112 | 5/1998 | Monma et al. | 324/244 |

FOREIGN PATENT DOCUMENTS

| | | |
|---|---|---|
| 0 680 614 B1 | 9/1996 | European Pat. Off. . |
| 1 256 427 | 12/1967 | Germany . |
| 27 05 099 | 8/1977 | Germany . |
| 35 44 877 A1 | 6/1986 | Germany . |

*Primary Examiner*—Randy W. Gibson
*Attorney, Agent, or Firm*—Herbert L. Lerner; Laurence A. Greenberg; Werner H. Sterner

[57] ABSTRACT

An electronic compass has a compass housing. An electronic magnetic field sensor is disposed in a fixed position relative to the compass housing. A magnet is rotatably mounted relative to the magnetic field sensor and independently aligned with a terrestrial magnetic field. The magnet has a magnetic field with a magnetic field direction and the electronic magnetic field sensor is located within a range of influence of the magnetic field. The electronic magnetic field sensor has a first magnetoresistor with a first fixed reference axis and an electric resistance of the first magnetoresistor is a function of a first angle of rotation between the fixed first reference axis and the direction of the magnetic field. The electronic magnetic field sensor defines a first differential bridge circuit and the first magnetoresistor is disposed in the first differential bridge circuit which during operation of the compass, supplies an output voltage dependent on the first angle of rotation. The first differential bridge circuit has a second magnetoresistor, and magnetizations of the first magnetoresistor and the second magnetoresistor are rotated relative to one another.

19 Claims, 3 Drawing Sheets

ELECTRONIC COMPASS

BACKGROUND OF THE INVENTION

Field of the Invention

The invention relates to an electronic compass having an electronic magnetic field sensor which is in a fixed position relative to a compass housing. The electronic compass also has a magnet mounted rotatably relative to the magnetic field sensor and is independently aligned with the terrestrial magnetic field. The electronic magnetic field sensor is located within the range of influence of a magnetic field generated by the magnet. The electronic magnetic field sensor has a first magnetoresistor with a fixed reference axis, whose electric resistance is a function of an angle of rotation between the fixed reference axis and the direction of the magnetic field. The magnetoresistor is arranged in a differential bridge circuit which supplies an output voltage dependent on the angle of rotation.

A device for detecting an angular position of an object with respect to a prescribed zero position and having a magnetoresistor (MR) sensor which has a fixed reference axis and is arranged in a magnetic field is disclosed, for example, in published European Patent Application 680 614 B1.

U.S. Pat. No. 4,640,016 discloses a compass in which magnetoresistive sensors are arranged in the magnetic field of a magnetic compass. The sensitivity, that is to say the resolution with reference to the angle of rotation of the compass is, however, not satisfactory, because of the excessively low sensitivity of the magnetoresistive sensors.

SUMMARY OF THE INVENTION

It is accordingly an object of the invention to provide an improved electronic compass which overcomes the above-mentioned disadvantages of the prior art devices and methods of this general type, in which the electronic compass has an enhanced display accuracy.

With the foregoing and other objects in view there is provided, in accordance with the invention, an electronic compass, comprising: a compass housing; an electronic magnetic field sensor disposed in a fixed position relative to the compass housing; a magnet rotatably mounted relative to the magnetic field sensor and independently aligned with a terrestrial magnetic field, the magnet has a magnetic field with a magnetic field direction and the electronic magnetic field sensor is located within a range of influence of the magnetic field; the electronic magnetic field sensor has a first magnetoresistor with a fixed first reference axis, an electric resistance of the first magnetoresistor is a function of a first angle of rotation between the fixed first reference axis and the direction of the magnetic field, the electronic magnetic field sensor defines a first differential bridge circuit and the first magnetoresistor is disposed in the first differential bridge circuit, the first differential bridge circuit supplies an output voltage dependent on the first angle of rotation; the first differential bridge circuit has a second magnetoresistor; and magnetizations of the first magnetoresistor and the second magnetoresistor are rotated relative to one another.

According to the invention, the differential bridge circuit has a second magnetoresistor in addition to the first magnetoresistor, and the magnetizations ($M_{MR1}$, $M_{MR2}$) of the first (MR1) and the second magnetoresistor (MR2) are rotated relative to one another. In contrast to prior art compasses, the compass of the instant application has a substantially higher display accuracy.

The electronic compass according to the invention has the particular advantage that there is no need to align the magnetic field sensor with the terrestrial magnetic field. Only the magnet must be aligned. The magnet advantageously has a very low mass and is mounted in an easily rotatable fashion. It can, for example, be constructed and mounted like a compass needle of a conventional compass.

In the electronic compass according to the invention, the electronic magnetic field sensor advantageously has a fixed reference axis, and an output signal of the electronic magnetic field sensor is a function of an angle of rotation enclosed between the fixed reference axis and the direction of the magnetic field.

The electronic magnetic field sensor has at least one magnetoresistor with a fixed reference axis, whose electric resistance is a function of an angle of rotation between the fixed reference axis and the direction of the magnetic field. During operation of the compass, the differential bridge circuit supplies an output voltage dependent on the angle of rotation.

In accordance with an added feature of the invention, the first differential bridge circuit has a first series circuit formed of the first magnetoresistor and the second magnetoresistor, and a second series circuit formed of two fixed resistors and connected in parallel with the first series circuit; the first series circuit and the second series circuit each have a first end, a center tap and a second end, and each is connected on the first end to a supply voltage and on the second end to a fixed potential; and the output voltage of the magnetic field sensor can be tapped from the center tap of the first series circuit and the center tap of the second series circuits.

In accordance with another feature of the invention, the magnetizations of the first magnetoresistor and the second magnetoresistor of the first series circuit are substantially directed opposite to one another.

In accordance with an additional feature of the invention, the first differential bridge circuit has a first series circuit formed of the magnetoresistor and the second magnetoresistor, and a second series circuit formed of a third magnetoresistor and a fourth magnetoresistor and connected in parallel with the first series circuit; the first series circuit and the second series circuit each have a first end, a center tap and a second end and each is connected on the first end to a supply voltage and on the second end to a fixed potential; and the output voltage of the magnetic field sensor is tapped from the center tap of the first series circuit and the center tap of the second series circuit.

In accordance with yet another added feature of the invention, the third magnetoresistor and the fourth magnetoresistor of the second series circuit have magnetizations which are rotated relative to one another.

In accordance with yet another additional feature of the invention, the magnetizations of the first magnetoresistor and the second magnetoresistor of the first series circuit are substantially directed opposite to one another, and the magnetizations of the third magnetoresistor and the fourth magnetoresistor of the second series circuit are substantially directed opposite to one another; and magnetizations of one of the first series circuit and the second series circuit are directed toward one another, and the magnetizations of an other is directed away from one another.

In accordance with yet another feature of the invention, the electronic magnetic field sensor has a fifth magnetoresistor with a fixed second reference axis which is disposed rotated relative to the first reference axis of the first magnetoresistor in such a way that the first reference axis and the second reference axis enclose an angle δ≠0, 180°, 360°, when projected onto a plane lying parallel to a plane of rotation of the magnet, and an electric resistance of the fifth magnetoresistor is a function of a second angle of rotation between the fixed second reference axis of the fifth magnetoresistor and the direction of the magnetic field.

In accordance with yet a further added feature of the invention, the electronic magnetic field sensor defines a second differential bridge and the fifth magnetoresistor is disposed in the second differential bridge circuit, the second differential bridge supplies a second output voltage dependent on the second angle of rotation.

In accordance with yet another further feature of the invention, the second differential bridge circuit has a first series circuit which includes the fifth magnetoresistor and a sixth magnetoresistor, and a second series circuit has two fixed resistors and is connected in parallel with the first series circuit; the first series circuit and the second series circuit of the second differential bridge circuit each have a first end, a center tap and a second end and are each connected on the first end to a supply voltage and on the second end to a fixed potential; and the second output voltage of the magnetic field sensor can be tapped from the center tap of the first series circuit and the center tap of the second series circuit of the second differential bridge circuit.

In accordance with an added feature of the invention, the fifth magnetoresistor and the sixth magnetoresistor of the first series circuit have magnetizations which are rotated relative to one another.

In accordance with another feature of the invention, the magnetizations of the fifth magnetoresistor and the sixth magnetoresistor of the first series circuit are substantially directed opposite to one another.

In accordance with an additional feature of the invention, the second differential bridge circuit has a first series circuit including the fifth magnetoresistor and a sixth magnetoresistor, and a second series circuit has a seventh magnetoresistor and an eighth magnetoresistor connected in parallel with the first series circuit; the first series circuit and the second series circuit of the second differential bridge circuit each have a first end, a center tap and a second end and each are connected on the first end to a supply voltage and on the second end to a fixed potential; and the second output voltage of the magnetic field sensor can be tapped between the center tap of the first series circuit and the center tap of the second series circuit of the second differential bridge circuit.

In accordance with yet another added feature of the invention, the fifth magnetoresistor and the sixth magnetoresistor of the first series circuit have magnetizations which are rotated relative to one another, and the seventh magnetoresistor and the eighth magnetoresistor of the second series circuit have magnetizations which are rotated relative to one another.

In accordance with a further added feature of the invention, the fifth magnetoresistor and the sixth magnetoresistor of the first series circuit have magnetizations which are substantially directed opposite to one another, and the seventh magnetoresistor and the eighth magnetoresistor of the second series circuit have magnetizations which are substantially directed opposite to one another; and magnetizations of one of the first series circuit and the second series circuit are directed toward one another, and the magnetizations of an other is directed away from one another.

In accordance with yet another feature of the invention, all of magnetoresistors are giant magnetoresistors (giant MRs).

The giant magnetoresistors are described, for example, in European Patent No. 680 614 B1, and for this reason are not explained in more detail at this juncture. The advantage of the giant MRs consists in that they can have an effect efficiency of up to 70%.

In accordance with a concomitant feature of the invention, the enclosed angle δ is equal to 90°.

A particularly preferred embodiment of the electronic compass according to the invention has at least one first and one second differential bridge circuit with in each case at least one magnetoresistor. The reference axes of the magnetoresistors of the first and the second differential bridge circuits are arranged rotated relative to one another by an angle δ≠0°, 180°, 360°, and preferably δ=90°.

This has the particular advantage that the output signals of the two differential bridge circuits, typically sinusoidal voltage signals, are offset relative to one another in the case of the rotation of the magnets with reference to the time axis. As a result, a unique determination of the orientation of the reference axis relative to the terrestrial magnetic field is ensured.

Other features which are considered as characteristic for the invention are set forth in the appended claims.

Although the invention is illustrated and described herein as embodied in an electronic compass, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
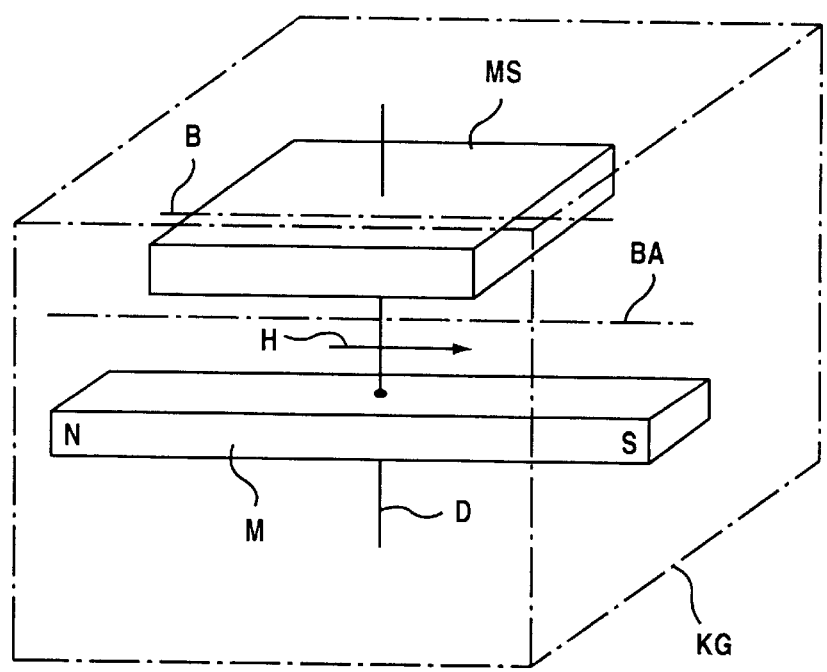
FIG. 1 is a diagrammatic, perspective view of an electronic compass according to the invention.

Referring now to the figures of the drawing in detail and first, particularly, to FIG. 1 thereof, there is shown a rotatably mounted magnet M (for example a compass needle) with a magnetic field H having a north pole N and a south pole S. The magnet M is arranged on a common axis of rotation D fixed in a compass housing KG with a component axis BA. Located above the magnet M is a magnetic field sensor MS, which is connected in a fixed and nonrotating fashion to the axis of rotation D, and thus is also in a fixed and nonrotating fashion to the compass housing KG, and has at least one fixed reference axis B.

Figure 2:
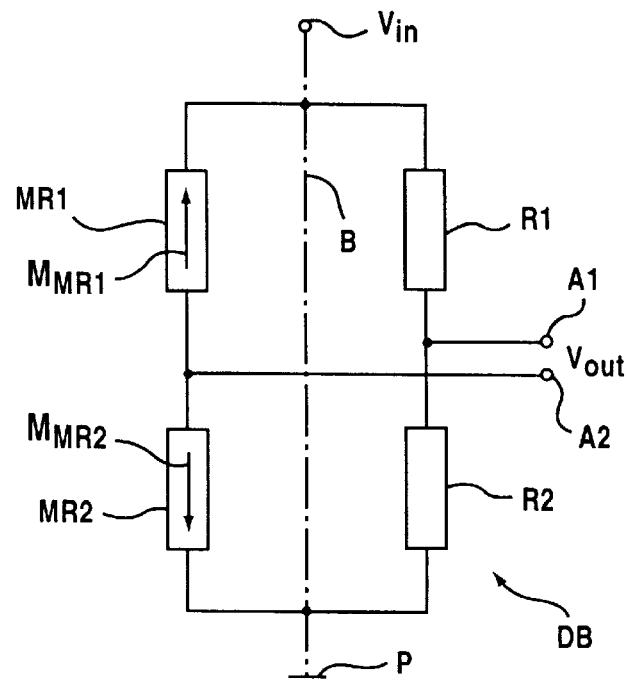
FIG. 2 is a schematic diagram of a first embodiment of a differential bridge circuit.
Figure 3:
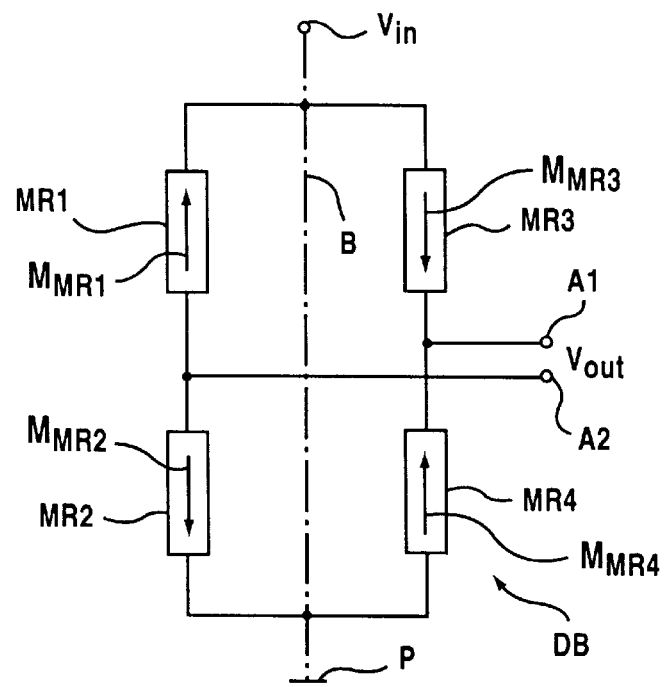
FIG. 3 is a schematic diagram of a second embodiment of the differential bridge circuit.

The examples shown in FIGS. 2 and 3 of differential bridge circuits can optionally be used as the magnetic field sensor MS in the case of the exemplary embodiment of FIG. 1.

In the differential bridge circuit DB shown in FIG. 2, there is a series circuit composed of two magnetoresistors MR1, MR2 whose magnetizations $M_{MR1}$, $M_{MR2}$ (indicated by arrows in the component symbols) are directed toward one another. This 10 represents the ideal arrangement with regard to the magnitude of the output signal, but it is also possible to use any other arrangement of the magnetizations $M_{MR1}$, $M_{MR2}$ relative to one another. A series circuit composed of two fixed resistors R1, R2 is connected in parallel with the two magnetoresistors MR1, MR2. This parallel circuit is connected on one end to a supply voltage $V_{in}$ and on the other end to a fixed reference potential P. The center tap between the two magnetoresistors MR1, MR2 is connected to a first terminal A2, and the center tap between the two fixed resistors R1, R2 is connected to a 20 second terminal A1. An output voltage $V_{out}$ of the differential bridge circuit DB which is dependent on the resistance values of the magnetoresistors MR1, MR2 can be tapped at these two terminals A1, A2. The two magnetoresistors MR1, MR2 are preferably giant MRs.

In the differential bridge circuit DB represented in FIG. 3, the two fixed resistors R1, R2 of the embodiment of FIG. 2 are advantageously replaced by two magnetoresistors MR3, MR4. The magnetization $M_{MR3}$ of the magnetoresistor MR3 is directed opposite to the magnetization $M_{MR1}$ of the magnetoresistor MR1, and the magnetization $M_{MR4}$ of the magnetoresistor MR4 is directed opposite to the magnetization $M_{MR2}$ of the magnetoresistor MR2. Once again, this represents the ideal arrangement with regard to the magnitude of the output signal, but it also possible to use any other arrangement of the magnetizations $M_{MR1}$, $M_{MR2}$, $M_{MR3}$, $M_{MR4}$ relative to one another. The rest of the configuration of the bridge circuit DB corresponds to that of the bridge circuit DB of FIG. 2. The last described circuit arrangement has, in particular, the advantage that a comparatively large output signal $V_{out}$ is generated. All the magnetoresistors MR1–MR4 are preferably giant MRs.

Figure 4:
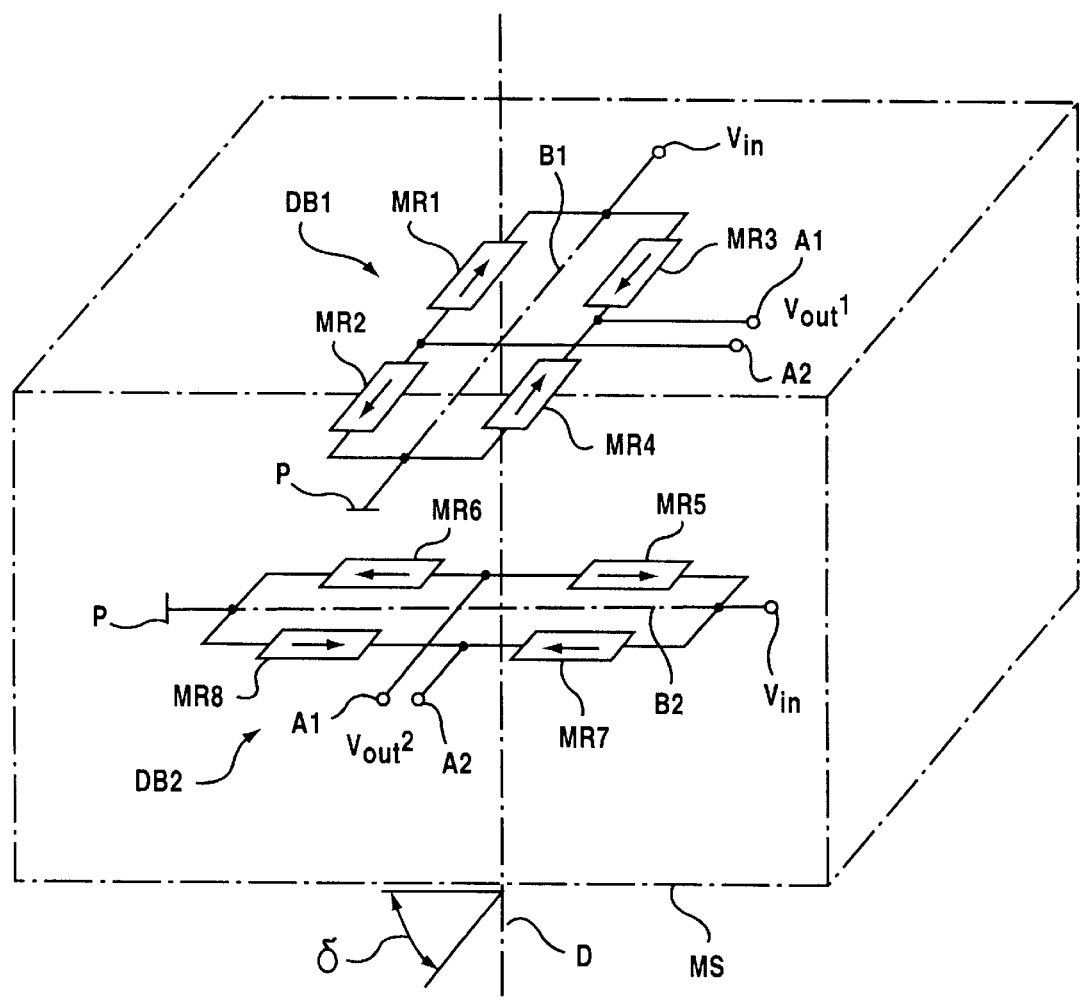
FIG. 4 is a diagrammatic, perspective view of a magnetic field sensor having two differential bridge circuits rotated relative to one another with regard to their reference axes.

In the embodiment, represented diagrammatically in FIG. 4, of the magnetic field sensor MS for use in an electronic compass, there is the first differential bridge circuit DB1 in accordance with FIG. 3 with the first reference axis B1, and the second differential bridge circuit DB2 in accordance with FIG. 3 with the second reference axis B2. In FIG. 4, the first and the second reference axes B1, B2 are orientated relative to one another in such a way that they enclose a right angle δ when projected onto a plane perpendicular to the axis of rotation D of the magnet M. The reference axes B1, B2 are defined by the magnetoresistors MR1–MR8. Such a magnetic field sensor MS can, of course, alternatively also be constructed with differential bridge circuits DB in accordance with FIG. 2. It is likewise possible for the angle δ enclosed by the reference axes B1, B2 to have another value greater than 0° but not equal to 180° or 360°. The smaller the angle δ, or to express it better, the further the angle δ differs from 90° or 27°, the less, however, is the difference (phase difference) between the two output voltages $V_{out}1$ and $V_{out}2$ at the differential bridge circuits DB1 and DB2.

Figure 5:
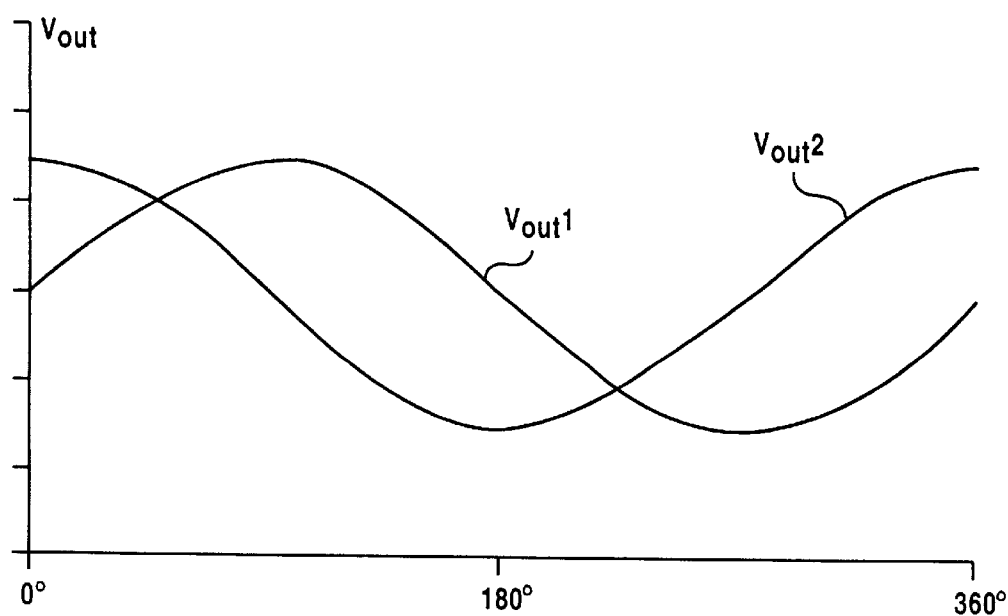
FIG. 5 is a graph of the signal characteristic from the two differential bridge circuits in which the reference axes of the electric resistance elements, which are dependent on the magnetic field, are arranged rotated relative to one another by 90° and the magnet is rotated by 360° overall relative to the magnetic field sensor.

In the case of a rotation of the magnet M by 360° about the axis of rotation D (abscissa: angle of rotation, ordinate: voltage), the diagram shown in FIG. 5 of an output signal characteristic of an electronic compass according to the invention and having a magnetic field sensor MS in accordance with FIG. 4 has two sinusoidal output voltages $V_{out}1$ and $V_{out}2$ from the two differential bridge circuits DB1 and DB2. These two sinusoidal output voltages $V_{out}1$ and $V_{out}2$ are offset relative to one another in accordance with the angle δ, that is to say, here, by 90°, with the result that every orientation of the magnetic field H of the magnet M relative to the magnetic field sensor MS is uniquely assigned a pair of values of the output voltage ($V_{out}1$, $V_{out}2$). As a result, it is possible with the aid of the pair of values of the output voltage ($V_{out}1$, $V_{out}2$) to determine the orientation of the magnet M, and thus also the orientation of the terrestrial magnetic field relative to the magnetic field sensor MS.

We claim:

1. An electronic compass, comprising:

a compass housing;

an electronic magnetic field sensor disposed in a fixed position relative to said compass housing;

a magnet rotatably mounted relative to said magnetic field sensor and independently aligned with a terrestrial magnetic field, said magnet having a magnetic field with a magnetic field direction and said electronic magnetic field sensor located within a range of influence of said magnetic field;

said electronic magnetic field sensor having a first magnetoresistor with a fixed first reference axis, an electric resistance of said first magnetoresistor being a function of a first angle of rotation between said fixed first reference axis and said direction of said magnetic field, said electronic magnetic field sensor defining a first differential bridge circuit and said first magnetoresistor disposed in said first differential bridge circuit, said first differential bridge circuit supplying an output voltage dependent on said first angle of rotation;

said first differential bridge circuit having a second magnetoresistor;

magnetizations of said first magnetoresistor and said second magnetoresistor rotated relative to one another; and said first differential bridge circuit having a first series circuit formed of said first magnetoresistor and said second magnetoresistor, and a second series circuit formed of a third resistor and a fourth resistor and connected in parallel with said first series circuit.

2. The electronic compass according to claim 1, wherein said first series circuit and said second series circuit each have a first end, a center tap and a second end, and each are connected on said first end to a supply voltage and on said second end to a fixed potential; and said output voltage of said magnetic field sensor to be tapped from said center tap of said first series circuit and said center tap of said second series circuits.

3. The electronic compass according to claim 2, wherein said magnetizations of said first magnetoresistor and said second magnetoresistor of said first series circuit are substantially directed opposite to one another.

4. The electronic compass according to claim 1, wherein said third resistor is a magnetoresistor and said fourth resistor is a magnetoresistor whose magnetizations are rotated relative to one another;

said first series circuit and said second series circuit each have a first end, a center tap and a second end and each are connected on said first end to a supply voltage and on said second end to a fixed potential; and said output voltage of said magnetic field sensor is tapped from said center tap of said first series circuit and said center tap of said second series circuit.

5. The electronic compass according to claim 4, wherein said third magnetoresistor and said fourth magnetoresistor of said second series circuit have magnetizations which are rotated relative to one another.

6. The electronic compass according to claim 5, wherein said magnetizations of said first magnetoresistor and said second magnetoresistor of said first series circuit are substantially directed opposite to one another, and said magnetizations of said third magnetoresistor and said fourth magnetoresistor of said second series circuit are substantially directed opposite to one another; and magnetizations of one of said first series circuit and said second series circuit are directed toward one another, and said magnetizations of an other is directed away from one another.

7. The electronic compass according to claim 1, wherein said electronic magnetic field sensor has a fifth magnetoresistor with a fixed second reference axis rotated relative to said first reference axis of said first magnetoresistor causing said first reference axis and said second reference axis to enclose an angle $\delta \neq 0$, 180°, 360°, when projected onto a plane lying parallel to a plane of rotation of said magnet, and an electric resistance of said fifth magnetoresistor is a function of a second angle of rotation between said fixed second reference axis of said fifth magnetoresistor and said direction of said magnetic field.

8. The electronic compass according to claim 7, wherein said electronic magnetic field sensor defines a second differential bridge and said fifth magnetoresistor is disposed in said second differential bridge circuit, said second differential bridge supplies a second output voltage dependent on said second angle of rotation.

9. The electronic compass as claimed in claim 8, wherein said second differential bridge circuit has a first series circuit including said fifth magnetoresistor and a sixth magnetoresistor, and a second series circuit having two fixed resistors and connected in parallel with said first series circuit;

said first series circuit and said second series circuit of said second differential bridge circuit each have a first end, a center tap and a second end and are each connected on said first end to a supply voltage and on said second end to a fixed potential; and said second output voltage of said magnetic field sensor is to be tapped from said center tap of said first series circuit and said center tap of said second series circuit of said second differential bridge circuit.

10. The electronic compass according to claim 9, wherein said fifth magnetoresistor and said sixth magnetoresistor of said first series circuit have magnetizations rotated relative to one another.

11. The electronic compass according to claim 9, wherein said magnetizations of said fifth magnetoresistor and said sixth magnetoresistor of said first series circuit are substantially directed opposite to one another.

12. The electronic compass according to claim 8, wherein said second differential bridge circuit has a first series circuit including said fifth magnetoresistor and a sixth magnetoresistor, and a second series circuit having a seventh magnetoresistor and an eighth magnetoresistor connected in parallel with said first series circuit;

said first series circuit and said second series circuit of said second differential bridge circuit each have a first end, a center tap and a second end and each are connected on said first end to a supply voltage and on said second end to a fixed potential; and said second output voltage of said magnetic field sensor is to be tapped between said center tap of said first series circuit and said center tap of said second series circuit of said second differential bridge circuit.

13. The electronic compass according to claim 12, wherein said fifth magnetoresistor and said sixth magnetoresistor of said first series circuit have magnetizations rotated relative to one another, and wherein said seventh magnetoresistor and said eighth magnetoresistor of said second series circuit have magnetizations rotated relative to one another.

14. The electronic compass according to claim 12, wherein said fifth magnetoresistor and said sixth magnetoresistor of said first series circuit have magnetizations substantially directed opposite to one another, and said seventh magnetoresistor and said eighth magnetoresistor of said second series circuit have magnetizations substantially directed opposite to one another; and magnetizations of one of said first series circuit and said second series circuit are directed toward one another, and said magnetizations of an other is directed away from one another.

15. The electronic compass according to claim 1, wherein said first magnetoresistor and said second magnetoresistor are giant magnetoresistors.

16. The electronic compass according to claim 4, wherein said third magnetoresistor and said fourth magnetoresistor are giant magnetoresistors.

17. The electronic compass according to claim 9, wherein said fifth magnetoresistor and said sixth magnetoresistor are giant magnetoresistors.

18. The electronic compass according to claim 12, wherein said seventh magnetoresistor and said eighth magnetoresistor are giant magnetoresistors.

19. The electronic compass according to claim 7, wherein said enclosed angle $\delta$ is equal to 90°.

* * * * *